United States Patent
Mason et al.

(10) Patent No.: US 7,663,637 B2
(45) Date of Patent: Feb. 16, 2010

(54) OVERRIDING LAYER PROPERTIES IN COMPUTER AIDED DESIGN VIEWPORTS

(75) Inventors: Karen Elaine Mason, Novato, CA (US); Qun Lu, Petaluma, CA (US); Thomas Allen Stoeckel, Jr., Clovis, CA (US); Stewart A. Sabadell, Novato, CA (US); Jose Madeira de Freitas Garcia, San Francisco, CA (US); John G. Ford, III, Mill Valley, CA (US)

(73) Assignee: AUTODESK, Inc., San Rafael, CA (US)

( * ) Notice: Subject to any disclaimer, the term of this patent is extended or adjusted under 35 U.S.C. 154(b) by 408 days.

(21) Appl. No.: 11/669,383

(22) Filed: Jan. 31, 2007

(65) Prior Publication Data
US 2008/0184111 A1 Jul. 31, 2008

(51) Int. Cl.
G09G 5/00 (2006.01)
G06F 17/00 (2006.01)
G06F 17/50 (2006.01)
G06G 7/70 (2006.01)
B60T 7/12 (2006.01)

(52) U.S. Cl. .................... 345/581; 345/419; 345/589; 715/200; 715/211; 715/781; 715/964; 701/15; 701/98; 701/182

(58) Field of Classification Search .............. 715/200, 715/211, 243, 273, 700, 764, 782, 781, 803, 715/275, 249, 964; 701/1, 15, 17, 90, 97–98, 701/118, 146, 180–182; 345/418–419, 426, 345/581, 619, 589, 440, 443
See application file for complete search history.

(56) References Cited

U.S. PATENT DOCUMENTS

| 6,134,338 | A  | * | 10/2000 | Solberg et al. ............ 382/113 |
| 6,346,939 | B1 | * | 2/2002  | Isaacs .................... 345/421 |
| 6,509,906 | B1 | * | 1/2003  | Awe et al. ................ 345/619 |
| 2002/0183982 | A1 |   | 12/2002 | Rauscher |
| 2005/0160354 | A1 |   | 7/2005  | Leino et al. |
| 2006/0106474 | A1 |   | 5/2006  | Mancuso et al. |
| 2006/0190116 | A1 | * | 8/2006  | Almeida et al. ........... 700/102 |
| 2007/0103490 | A1 | * | 5/2007  | Foster ................... 345/634 |
| 2008/0052618 | A1 | * | 2/2008  | McMillan et al. ......... 715/249 |

OTHER PUBLICATIONS

International Search Report. Jul. 22, 2008.

\* cited by examiner

*Primary Examiner*—Wesner Sajous
(74) *Attorney, Agent, or Firm*—Patterson & Sheridan, LLP

(57) ABSTRACT

Embodiments of the invention provide techniques for overriding layer display properties in computer-aided design (CAD) viewports. A method of generating a display representation of a CAD drawing includes identifying one or more layers of the CAD drawing to include in the display representation. Each of the one or more layers may be associated with a set of drawing elements and a set of layer display properties. The method also includes identifying a viewport display property for a first layer of the one or more layers and generating the display representation. The display representation may include the drawing elements associated with the one or more layers, and the appearance of the drawing elements associated with the first layer is based on the viewport display property.

23 Claims, 8 Drawing Sheets

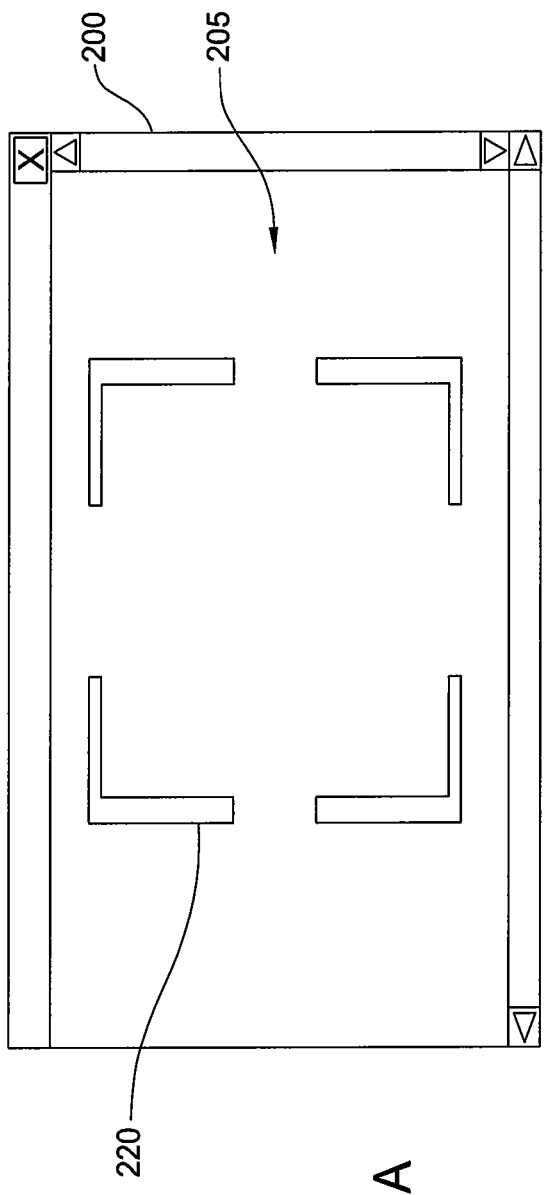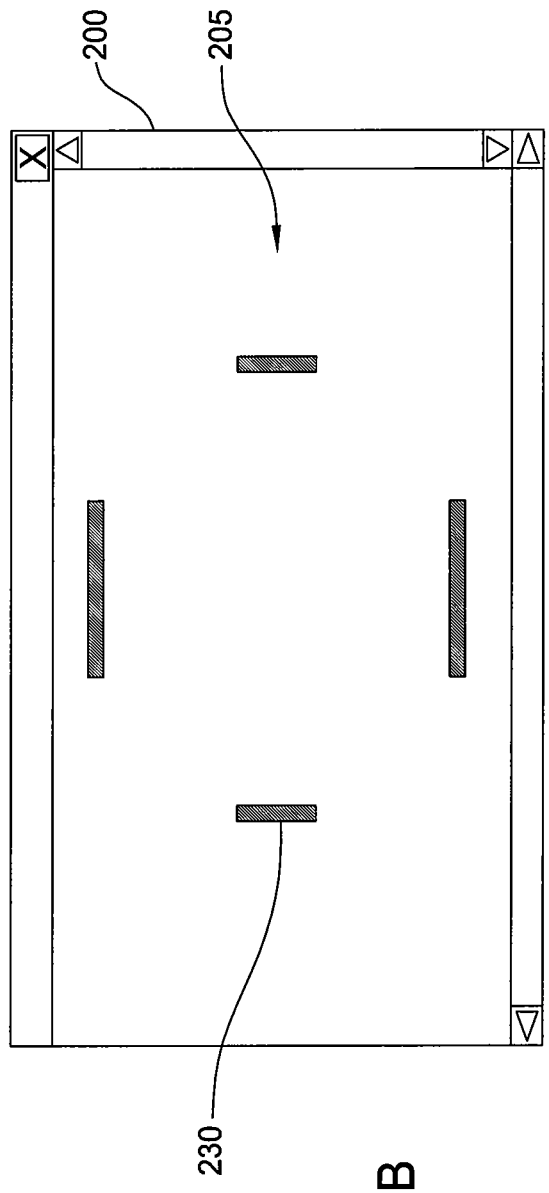

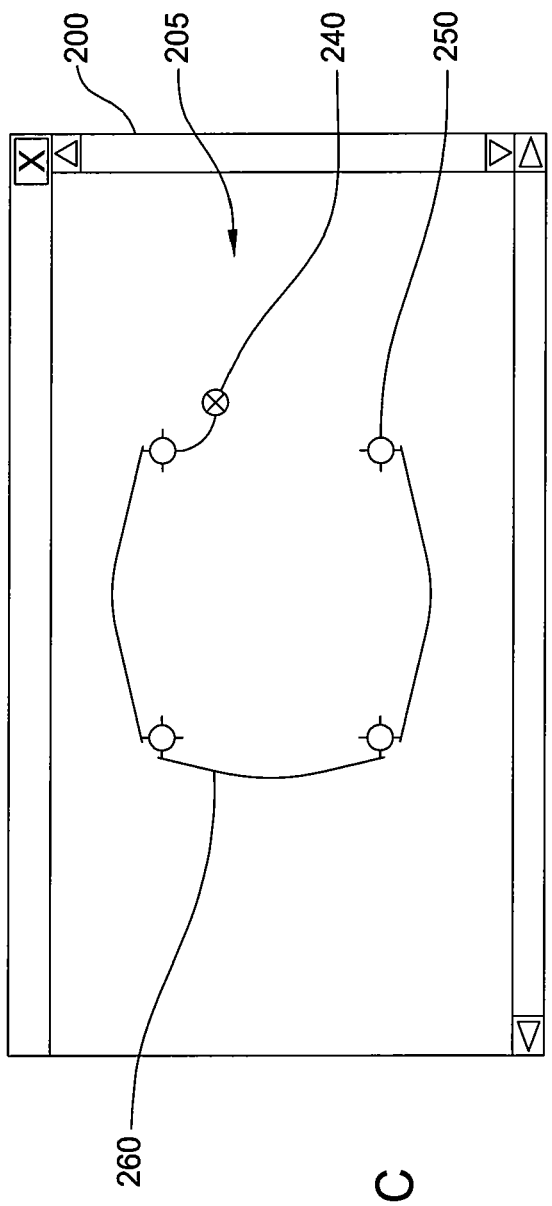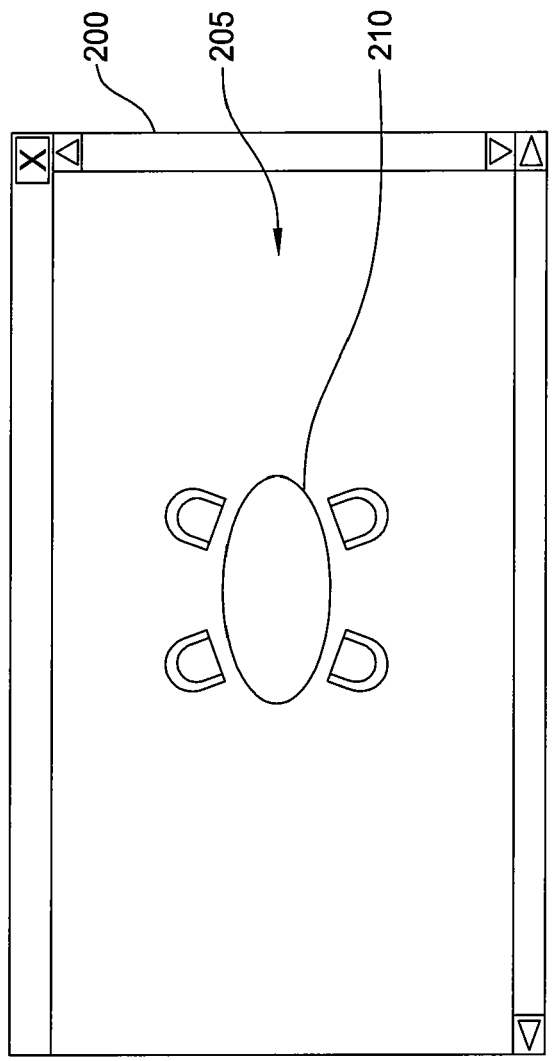
FIG. 2C
FIG. 2D

| VIEWPORT LAYER OVERRIDES MANAGER | | | | | |
|---|---|---|---|---|---|
| VIEWPORT NAME: ELECTRICIANS | | | | | |
| LAYER | HIDDEN | COLOR | LINETYPE | LINEWEIGHT | PLOTSTYLE |
| WALLS | NO | GREY | DASHED | LIGHT | STANDARD |
| DOORS | NO | GREY | DASHED | LIGHT | STANDARD |
| FURNITURE | YES | BLACK | SOLID | NORMAL | STANDARD |
| ELECTRICAL | NO | BLACK | SOLID | HEAVY | STANDARD |

FIG. 4B

OVERRIDING LAYER PROPERTIES IN COMPUTER AIDED DESIGN VIEWPORTS

BACKGROUND OF THE INVENTION

1. Field of the Invention

The present invention generally relates to computer software. More specifically, the present invention relates to techniques for overriding layer properties in computer-aided design (CAD) viewports.

2. Description of the Related Art

The term computer-aided design (CAD) generally refers to a broad variety of computer-based tools used by architects, engineers, and other construction and design professionals. CAD applications may be used to construct CAD drawings that include computer models of real-world objects, e.g., a machine part, a car, a house, or a building.

In many cases, a CAD drawing may include a number of layers, with each layer including a set of drawing objects. Generally, a layer defines a transparent overlay on which users organize and group different kinds of drawing objects. Layers are used to control the visibility of objects as well as to assign properties to objects. For example, in a CAD drawing of a building, a user may include a layer for walls, a layer for electrical wiring and fixtures, a layer for furniture, and a layer for doors, etc. Layers also allow users to more easily manage related drawing objects included in a drawing and control over the appearance of a printed or screen-display of a CAD drawing. For example, at a basic level, a user may turn on (or off) the display of a given layer. Further, display properties may define the general appearance of a objects included on a given layer. The style properties for a given layer typically include, among others, line color, line type or line style, line thickness, and plot style. By setting different display properties for the various layers of a CAD drawing, different aspects of the drawing may be emphasized (or deemphasized). For example, a dashed line type is often used to display objects in a background layer.

Some CAD applications allow users to define a particular set of layers from a CAD drawing to include in a customized view-generally referred to as a viewport. A viewport may be configured to present the CAD drawing from a particular point of view (e.g., plan view, elevation view, etc.) and for a particular scale (i.e., zoom.) Typically, a viewport is configured to present the point of view, scale, and layers of a CAD drawing that are most relevant for a specific use. For example, a viewport may be created for use by electricians taking part in the construction of a building that includes a layer for the walls of a room and a layer for electrical wiring and fixtures for that room. By contrast, a layer for doors and a layer for furniture may be omitted from the viewport since electricians generally do not require the information in those layers. By omitting the unnecessary layers, the viewport results in a drawing display that is less cluttered and thus easier for the electricians to use.

A viewport may also be adapted for a specific use by setting the display properties of the included layers to emphasize the parts of the CAD drawing that are most relevant to the intended use. Returning to the above example of a viewport created for electricians, the display properties of the layer for the walls may be set so the lines of this layer are thin and colored grey, and the display properties of the layer for electrical wiring and fixtures may be set so the lines of this layer are thick and colored red. Thus, the parts of the CAD drawing that are most important to electricians may be emphasized when the CAD drawing is displayed using this viewport.

However, changing the display properties of a layer for a particular viewport may cause a number of problems. Since the same layer may be included in many viewports, the display properties required for one viewport may conflict with the display properties required for other viewports. Similarly, the display properties required for one viewport may conflict with the display properties of the overall CAD drawing if the layer is included in displays of the CAD drawing. One solution for this problem is to create separate copies of a layer for each viewport in which that layer is included and to customize each copy of the layer with display properties used for a particular view of the CAD drawing.

One drawback to this approach, however, is that it requires that changes to the drawing objects included in one copy of the layer be replicated in each of the other copies of the layer. This process of propagating changes through copies of a layer is time-consuming and error-prone. In addition, if there are multiple layers in each viewport, and if the layers must be copied to multiple viewports, the duplication of layers can result in large file sizes for a given CAD drawing.

As the foregoing discussion illustrates, there remains a need in the art for improved techniques for generating display representations of CAD drawings.

SUMMARY OF THE INVENTION

Embodiments of the invention allow users to adjust layer display properties of a CAD drawing on a per-viewport basis. For example, a user may override a layer color used for drawing elements in a particular viewport, without changing the layer color for other model views or viewports (which themselves may specify their own per-viewport layer color). Other per-viewport layer properties may include line color, line type or line style, line thickness, and plot style. Thus, users may create per-viewport layer properties for these (and other) layer properties customized for a particular purpose. Of course, the display properties that a user can set on a per-viewport basis may be tailored to suit the needs of an individual case.

One embodiment of the invention provides a method of generating a display representation of a CAD drawing. A method of generating a display representation of a CAD drawing includes identifying one or more layers of the CAD drawing to include in the display representation. Each of the one or more layers may be associated with a set of drawing elements and a set of layer display properties. The method also includes identifying a viewport display property for a first layer of the one or more layers and generating the display representation. The display representation may include the drawing elements associated with the one or more layers, and the appearance of the drawing elements associated with the first layer is based on the viewport display property.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

It is to be noted, however, that the appended drawings illustrate only typical embodiments of this invention and are therefore not to be considered limiting of its scope, for the invention may admit to other equally effective embodiments.

FIGS. 2A-2D are conceptual illustrations of a screen display, each showing a different layer of a CAD drawing, according to one embodiment of the invention.

FIGS. 4A-4B are conceptual illustrations of a screen display of a viewport layer overrides manager, according to one embodiment of the invention.

DETAILED DESCRIPTION

Embodiments of the invention allow users to specify per-viewport layer display properties. The per-viewport display properties may override more general layer display properties associated with a set of layers in a computer-aided design (CAD) drawing. In one embodiment, a per-viewport display property may be associated with both a particular layer and viewport. In other words, more general layer properties are usually associated with a layer and are used in all viewports, unless there is an override set using a per-viewport display property. For example, a per-viewport display property may specify a line color, line type or line style, line thickness, and/or plot style to use in generating screen displays (or printed images) of that layer in the viewport. At the same time, the appearance of drawing elements generated for that layer using other viewports, or other general views of the CAD drawing are unaffected by the per-viewport display properties.

In one embodiment, a graphical user interface (GUI) provided by a CAD application includes a viewport layer overrides manager. The overrides manager allows users to define per-viewport display properties for the layers included in a given viewport. When the CAD drawing is displayed using that viewport, the style properties specified in the viewport overrides manager are used. Thus, users can define viewports to provide a variety of custom views of a CAD drawing, without affecting the appearance of the same layers in other viewports or in other displays of the CAD drawing, and without having to maintain multiple copies of a drawing layer.

Figure 1:
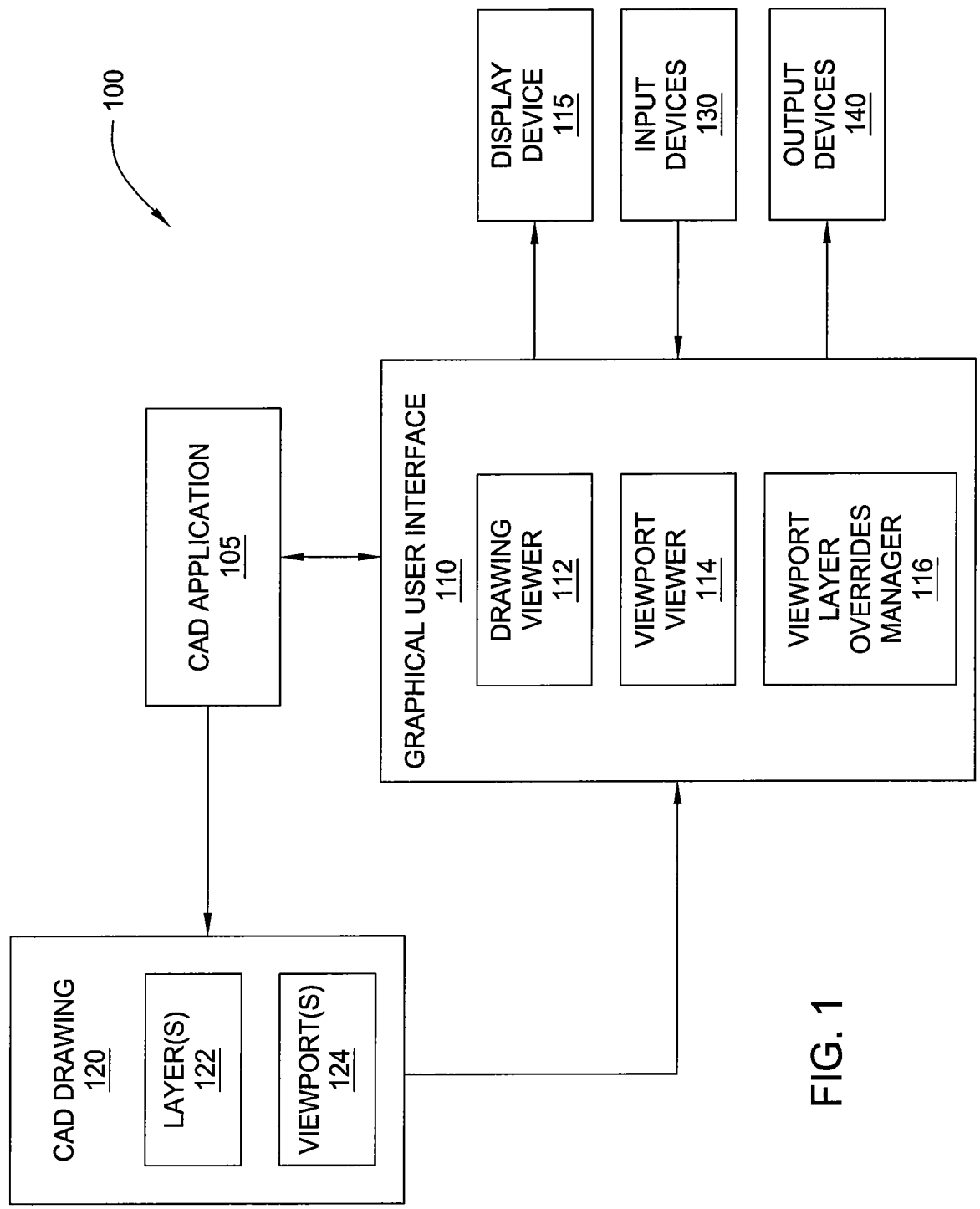
FIG. 1 is a block diagram illustrating a computer system for overriding layer properties in CAD viewports, according to one embodiment of the invention.

FIG. 1 is a block diagram illustrating a computer system for overriding layer properties in CAD viewports, according to one embodiment of the invention. The components illustrated in system 100 are included to be representative of computer software applications executing on existing computer systems, e.g., desktop computers, server computers, laptop computers, tablet computers, and the like. The software applications described herein, however, are not limited to any particular computing system or device and may be adapted to take advantage of new computing systems and devices as they become available.

Additionally, some components illustrated in system 100 may be implemented as software applications that execute on a single computer system or on distributed systems communicating over computer networks including local area networks or large, wide area networks, such as the Internet. For example, system 100 may include a GUI 110 executing on a client computer system at one physical location communicating with a CAD application 105 at another physical location. Also, CAD application 105 and GUI 110 may be provided as an application program (or programs) stored on computer readable media such as a CD-ROM, DVD-ROM, flash memory module, or other tangible storage media.

As shown, system 100 includes, without limitation, CAD application 105, GUI 110, a CAD drawing 120, a display device 115, a set of input devices 130, and a set of output devices 140. CAD application 105 may be any software application used for computer-aided design. For example, the AutoCAD® software application (and associated utilities) available from Autodesk, Inc., may be used. Typically, user input devices 130 include a mouse and keyboard, display device 115 includes a computer monitor, and output devices 140 include a printer device.

Illustratively, CAD drawing 120 includes layers 122 and viewports 124. Each layer 122 may include a set of drawing objects. For example, one layer 122 could include a set of wall objects in a CAD drawing of a building, another layer could include electrical wiring, plugs, and switches, and another layer could include furniture. By grouping objects in separate layers users may easily manage related drawing elements present in CAD drawing 120. Additionally, layers 122 may be used to control the appearance of related drawing elements in CAD drawing 120 when it is printed or displayed. For example, each layer may include a set of display properties such as line color, line type or line style, line thickness, and/or plot style. Examples of line types or line styles include dashed and solid lines. Line thickness indicates how thick a given line should be drawn. Plot styles provide a setting for drawing objects to have one appearance in an on-screen display, and another appearance in plotted output (i.e., printed). A plot style may change the color, line type or style, and line weight display properties of an object. One of ordinary skill in the art will understand, however, that the display properties of line color, line type or line style, line thickness, and plot style are included to be representative of layer display properties, and that other layer display properties may be used to suit the needs of a particular case.

As stated, the appearance of drawing elements on each individual layer 122 may be controlled using a set of layer display properties. By setting display properties for the drawing elements included on various layers 122, particular features may be emphasized (or deemphasized) in a particular presentation of CAD drawing 120. For example, a dashed line style is often used for drawing elements on one layer to represent that the elements are inside, under, or otherwise covered by drawing elements on another layer. In one embodiment, viewports 124 are used to provide customized views of CAD drawing 120. Each viewport 124 may include a set of layers 122 seen from a particular viewpoint (e.g., plan view, elevation view, etc.) and a particular scale (i.e., zoom.) Typically, a viewport 124 is created to present a view of a CAD drawing 120 relevant for a specific use.

As shown, GUI 110 includes a drawing viewer 112, a viewport viewer 114, and a viewport layer overrides manager 116. Drawing viewer 112 may be configured to generate a display of CAD drawing 120. When CAD drawing 120 is displayed using drawing viewer 112, the appearance of drawing elements included in CAD drawing 120 may be generated from the display properties defined for layers 122. For example, a layer properties manger (not shown) may be used to specify display properties for the drawing elements on a given layer 122.

Viewport viewer 114 may be configured to generate a display of CAD drawing 120, using one of viewports 124. As stated, each individual viewport 124 may specify which layers 122 to use in generating visual (or printed) displays of CAD drawing 120. Additionally, in one embodiment, the display properties for a given layer 122 may be specified on a per-viewport basis. That is, a more general layer display property specified for a given layer 122 may be overridden by a per-viewport display property specified by one of viewports 124 that includes the given layer 122.

Additionally, viewport viewer 114 may present CAD drawing 120 from a particular position and scale specified by viewport 124. For example, viewport 124 may provide a plan, section, or elevation view of a building design shown at a specified scale. In one embodiment, CAD application 105 and viewport viewer 114 use any per-viewport display properties specified by viewport 124 to generate on-screen (and printed) displays of CAD drawing 120, rather than generally layer display properties of the layers 122. Thus, the display properties for a given layer 122 may be overridden on a per-viewport basis. As used herein, a per-viewport display property or display property override refers to a layer display property associated with a specific viewport 124. That is, the per-viewport display property overrides a display property for a given layer, but does not alter the same display property for that layer generally. The viewport layer overrides manager 116 allows a user to specify viewport layer overrides for one of viewports 124.

FIGS. 2A-2D are a conceptual illustration of a screen display 200, each showing a different layer of a CAD drawing 205, according to one embodiment of the invention. As is known, drawing objects in a CAD drawing 205 may be grouped into layers, each layer including a specified collection of drawing objects. In this example, CAD drawing 205 represents a design for a room. FIG. 2A illustrates a layer 220 for the walls of the room of CAD drawing 205. FIG. 2B illustrates a layer 230 for the doors of the room. FIG. 2C illustrates a layer 260 for the electrical wiring and fixtures of the room, including a wall switch 240, a set of overhead lights 250, and a set of electrical wires. FIG. 2D illustrates a layer 210 for the furniture of the room.

Figure 3:
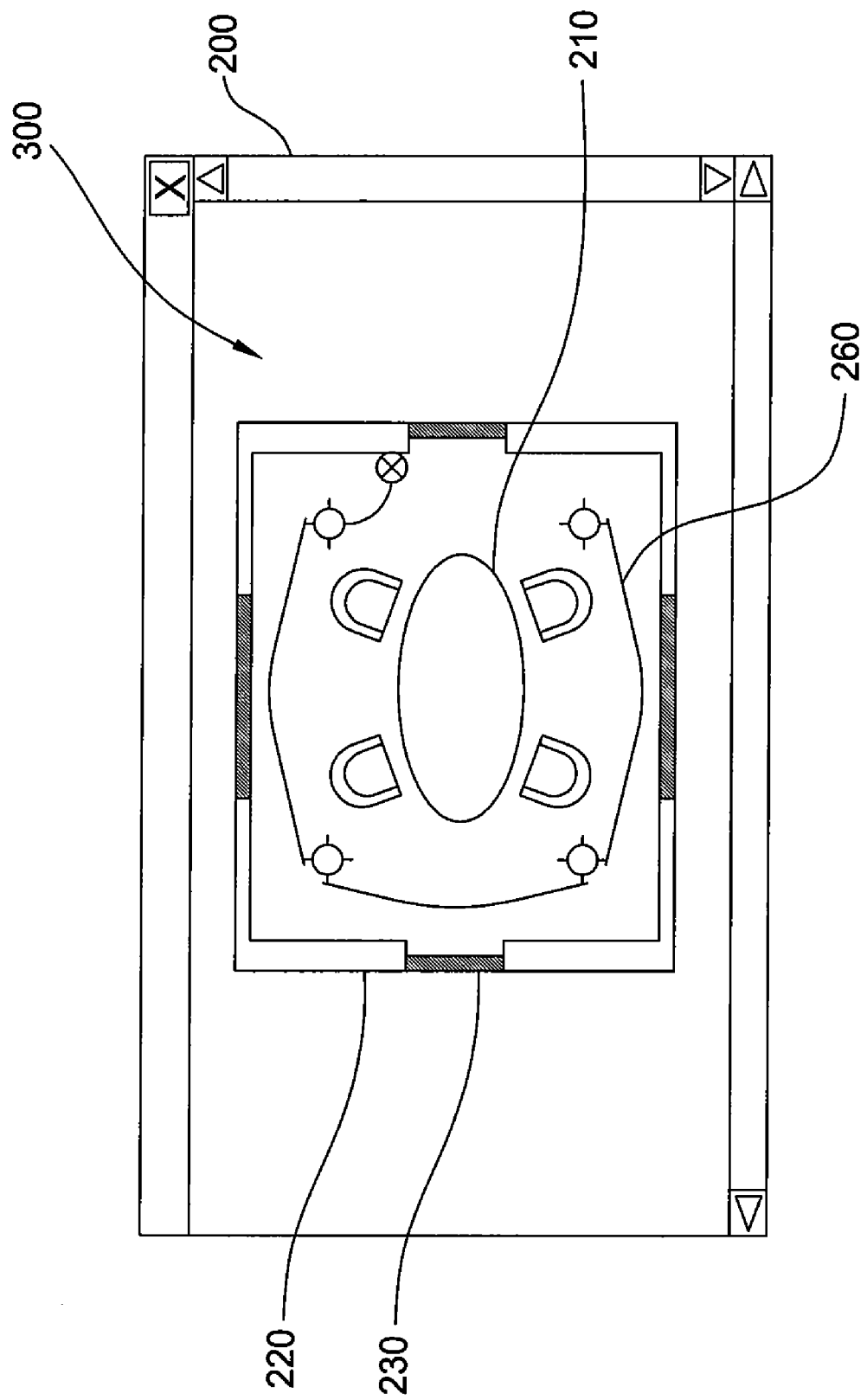
FIG. 3 illustrates a screen display displaying a viewport of a CAD drawing, according to one embodiment of the invention.

FIG. 3 is a conceptual illustration of screen display 200 displaying a viewport 300 view of the CAD drawing 205 shown in FIGS. 2A-2D, according to one embodiment of the invention. As described herein, a viewport may include one or more drawing layers and may be used to present a particular view of a CAD drawing. In the example shown in FIG. 3, viewport 300 displays a view of CAD drawing 205. Illustratively, viewport 300 includes the drawing objects on a furniture layer 210, a walls layer 220, a doors layer 230, and a wiring and fixtures layer 260. Further, the layers included in viewport 300 are all displayed according to a set of display properties specified for each layer. As shown in FIG. 3, walls layer 220, furniture layer 210, and electrical wiring and fixtures layer 260 are displayed using a solid, narrow line using black color. Also the drawing elements of doors layer 230 are displayed using a solid black outline with a cross-hatch pattern.

In some cases, a viewport that displays multiple layers of a CAD drawing using similar display properties may be perceived as cluttered and confusing. For example, the display of CAD drawing viewport 300 may not be useful for an electrician. However, as illustrated in FIGS. 4A-4B, per-viewport display properties may be specified for viewport 300 in order to create a view of CAD drawing 205 that emphasizes drawing elements on certain drawing layers and deemphasizes drawing elements on others.

Figure 4A:
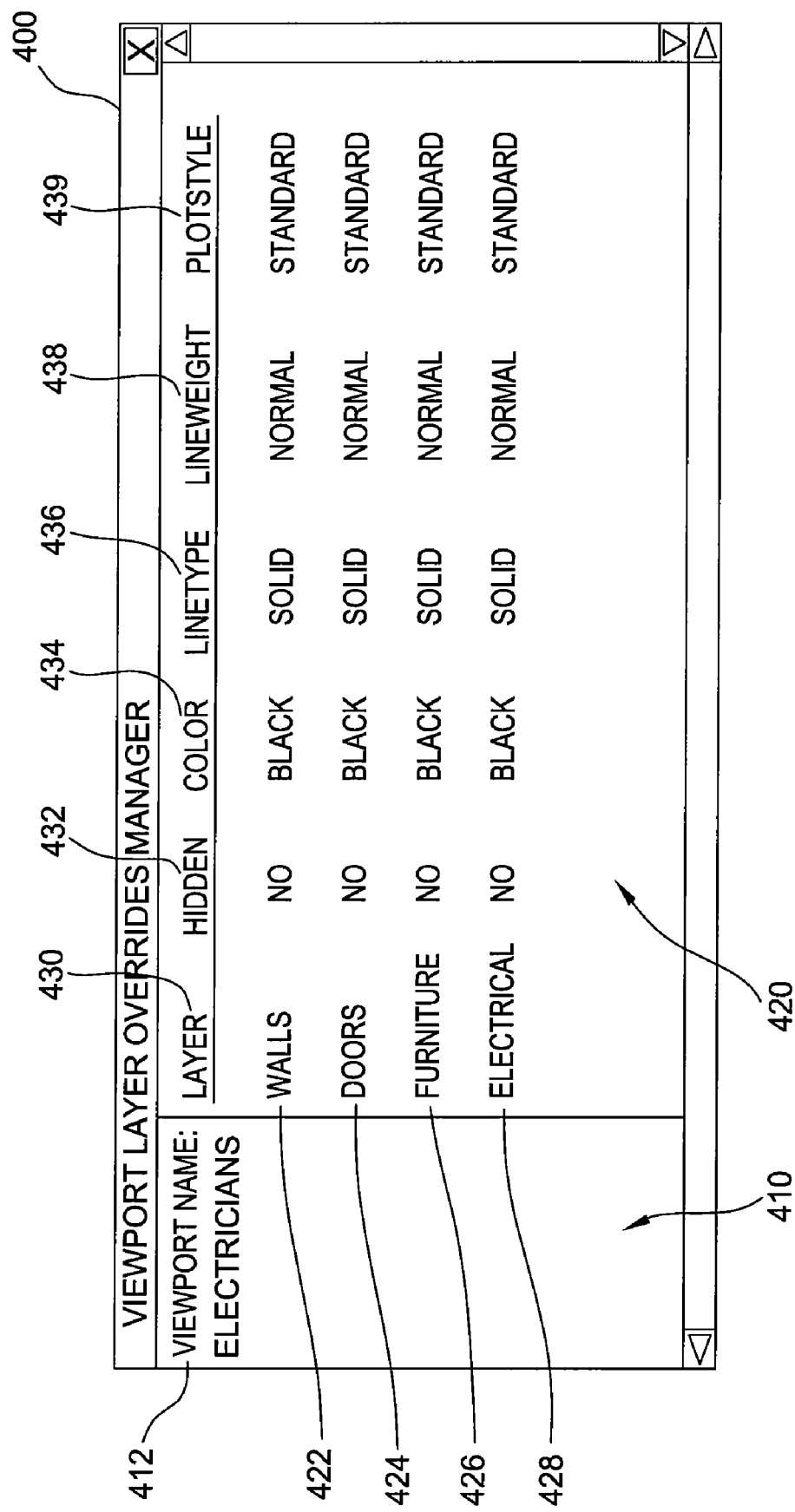

FIGS. 4A-4B are conceptual illustrations of a screen display 400 of viewport layer overrides manager, according to one embodiment of the invention. More specifically, FIGS. 4A-4B illustrates an exemplary dialog box that may be used to specify per-viewport display properties for a viewport. As shown, screen display 400 includes a viewport name section 410 and a layer list 420. In this example, screen display 400 provides a definition of the viewport 300 shown in FIG. 3. Illustratively, viewport name section 410 specifies viewport name 412 of "ELECTRICIANS," indicating that viewport 300 is intended to be used by electricians.

Also as shown, layer list 420 includes a set of rows. Each row corresponds to one of the layers of CAD drawing 205; namely, the four layers shown in FIGS. 2A-2D. Specifically, row 422 corresponds to walls layer 220, row 424 corresponds to doors layer 230, row 426 corresponds to furniture layer 210, and row 428 corresponds to wiring and fixtures layer 260. In this example, layer list 420 includes a column 430 for the layer name, a column 432 indicating whether the layer is hidden or visible in viewport 300. Layer list 420 also includes a set of per-viewport display properties to use for each of layers 210, 220, 230, and 260.

In one embodiment, the per-viewport display properties for a given layer may default to the display properties of that layer. That is, the per-viewport display properties may initially match the more general layer display properties for a given layer, until changed. Thus, the per-viewport display properties shown in FIG. 4A correspond to the appearance of the CAD drawing shown in FIG. 3. The layer display properties that may be modified on a per-viewport basis are listed in columns 432, 434, 436, 438, and 439. In this example, a column 434 for layer color, a column 436 for layer line type or style, a column 438 for layer line weight, and a column 439 for layer plot style. Illustratively, column 432 indicates that the layers are not "hidden" (i.e., visible), and columns 434, 436, 438, indicate that the lines of the layers should be colored "black," using a "solid" line type, and "normal" line weight (i.e., line width). Additionally column 439 indicates that the layers included in CAD drawing 205 should be plotted (i.e., printed) using a "standard" plot style. Of course, the layer displays properties that may be modified on a per-viewport basis to suit the needs of a particular case.

Figure 5:
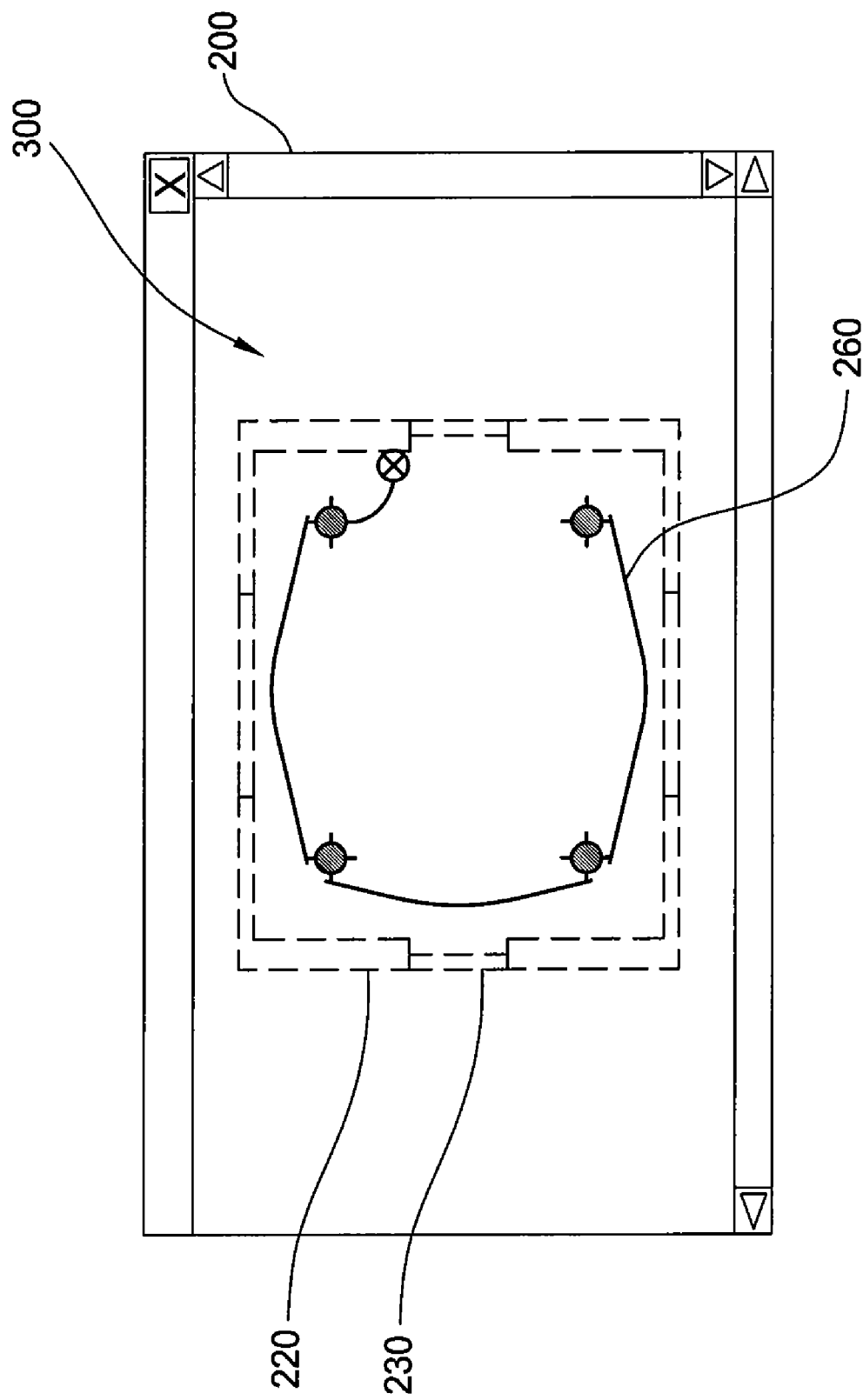
FIG. 5 is a conceptual illustration of a screen display that shows a viewport view of a CAD drawing, according to one embodiment of the invention.

As described, in one embodiment, users may specify per-viewport display properties for the layers included in a CAD. For example, a user may select a specific row and column and specify a per-viewport display property. This illustrated in FIG. 4B, which shows layer list 420 after being modified. As shown, walls row 422 and doors row 424 have been modified, with columns 434, 436, 438 indicating that lines of layers 220, 230 should be displayed using a "grey" color, a "dashed" line type, and a "light" line weight. Furniture row 426 has also been modified, with column 432 indicating that the drawing elements included in furniture layer 210 are now hidden (i.e., not visible) in viewport 300. Additionally, the display property specified wiring and fixtures row 428 has been modified; with column 434 indicating that the lines of electrical wiring and fixtures layer 260 should be displayed using a "heavy" line weight. FIG. 5 illustrates the result of these modifications on the appearance of CAD drawing 205, when viewed using the per-viewport display properties of viewport 300 illustrated in FIG. 4B.

FIG. 5 is a conceptual illustration of a screen display 500 that shows a viewport 300 view of CAD drawing 205, using the display property overrides shown in FIG. 4B, according to one embodiment of the invention. As shown, the lines of walls layer 220 and doors layer 230 are grey in color, dashed, and have a light line weight. These display properties correspond to the display property settings for walls row 422 and doors row 424 of layer list 420 in FIG. 4B. Furniture layer 210 is no longer visible in viewport 300, based on the display setting for the furniture layer in row 426 and "Hidden" column 432. Finally, the display of electrical wiring and fixtures layer 260 have a heavy line weight, which corresponds to the display settings for the wiring and fixtures layer in row 428. By virtue of these modifications, viewport 300 may be better adapted for electricians, with the relevant parts of CAD drawing 205 (e.g., electrical wiring and fixtures) emphasized, and with the less important parts either deemphasized (e.g., walls and doors) or hidden (e.g., the furniture).

For the sake of illustration, embodiments of the invention are described herein in terms of screen displays. However, it is also contemplated that documentation derived from a viewport may be generated according to the display properties set in the viewport overrides, e.g., using a per-viewport plot style display property. That is, any hard-copy output of a viewport, for example a paper print-out, may have the display properties and appearance specified in the viewport layer overrides.

Figure 6:
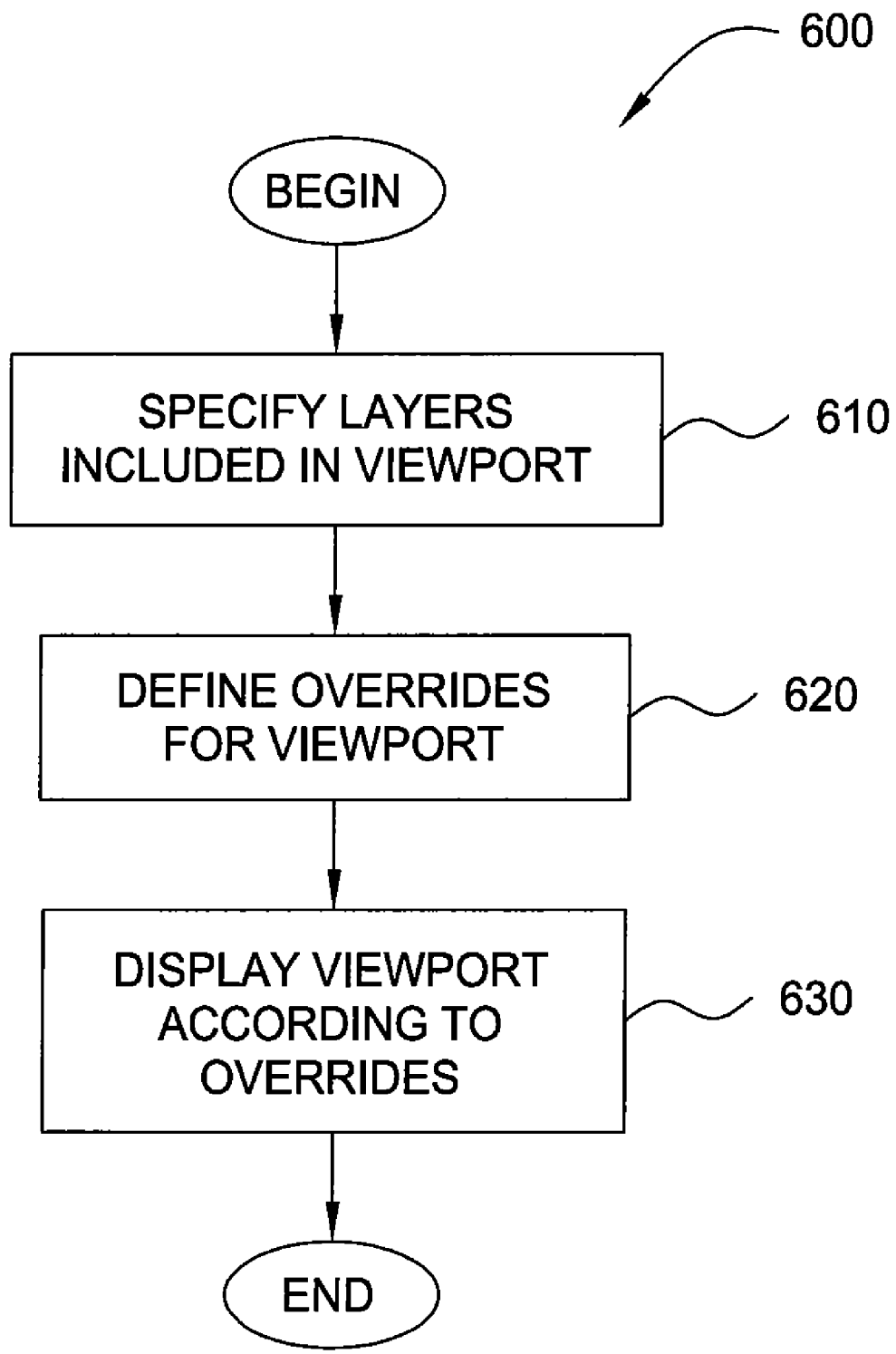
FIG. 6 illustrates a method for overriding layer properties in CAD viewports, according to one embodiment of the invention.

FIG. 6 illustrates a method 600 for overriding layer display properties in a CAD viewport, according to one embodiment of the invention. Persons skilled in the art will understand that any system configured to perform the steps of method 600, in any order, is within the scope of the present invention.

As shown, method 600 begins at step 610, where one or more layers may be specified as being visible for a given viewport. For example, a graphical user interface like the one shown in FIGS. 4A-4B may be used to define a desired viewport view of CAD drawing 120. In such a case, a user may specify some layers as visible and other layers as hidden for the being defined. In one embodiment, when a CAD drawing is viewed using a given viewport, only the drawing elements on visible layers are included in displays of that CAD drawing.

At step 620, overrides for the viewport are defined. That is, a user may specify one or more per-viewport specific display properties for the viewport being defined. As described, the per-viewport display properties may override more general layer display properties. For example, the graphical user interface shown in FIGS. 4A-4B allows users to set "color," "line type," "line weight," and "plot style" to use for drawing elements in the layers of the viewport being defined. Of course, the display properties that a user can set on a per-viewport basis may be tailored to suit the needs of an individual case.

At step 630, when a display representation of a given CAD drawing is generated using the viewport definition specified by steps 610 and 620, the appearance the elements of a given drawing layer may be based on the display properties defined for that layer and that viewport, instead of the display properties defined for that layer for general display and all other viewports. Additionally, the viewport definition may be saved as part of the CAD drawing, or made available generally as a viewport definition used to generate display representations of any CAD drawing that includes the layers specified by the viewport definition. As stated, display representations may include both on-screen displays as well as printed displays of the CAD drawing based on the viewport.

Advantageously, embodiments of the invention allow users to adjust layer display properties on a per-viewport basis. For example, a user may change a color used for drawing elements in one viewport, but maintain the original color of that layer color in the other views of the CAD drawing and other viewports. Frequently, users may desire to modify line weight and line color on a per-viewport basis to create viewports of a CAD drawing customized for a particular purpose. Other examples of properties that may be overridden on a viewport specific basis include line type and plot style.

While the forgoing is directed to embodiments of the present invention, other and further embodiments of the invention may be devised without departing from the basic scope thereof, and the scope thereof is determined by the claims that follow.

What is claimed is:

1. A computer-implemented method of generating a display representation of a computer-aided design (CAD) drawing stored on a computing device, comprising:
   loading the computer-aided design (CAD) drawing into a system memory of the computing device;
   identifying one or more layers of the CAD drawing to include in the display representation, wherein each of the one or more layers is associated with a set of drawing elements and a set of layer display properties specifying a first drawing style to use for the set of drawing elements associated with a respective layer;
   identifying a viewport display property for a first layer of the one or more layers, wherein the viewport display property specifies a second drawing style to use for the set of drawing elements associated with the first layer;
   overriding the first drawing style specified in the set of layer display properties with the second drawing style specified by the viewport display property;
   generating the display representation, wherein the display representation includes the drawing elements associated with the one or more layers, and the appearance of the drawing elements associated with the first layer is based on the viewport display property; and
   displaying on a display device a representation of the CAD model.

2. The method of claim 1, wherein the viewport display property specifies a line color to use in generating the display representation of the drawing elements associated with the first layer.

3. The method of claim 1, wherein the viewport display property specifies a line type to use in generating the display representation of the drawing elements associated with the first layer.

4. The method of claim 1, wherein the viewport display property specifies a line weight to use in generating the display representation of the drawing elements associated with the first layer.

5. The method of claim 1, wherein the viewport display property specifies a plot style to use in generating the display representation of the drawing elements associated with the first layer.

6. The method of claim 1, wherein a viewport definition specifies a display view type and zoom factor to use in generating the display representation.

7. The method of claim 6, wherein the display view type is a plan, elevation, or sectional view of the one or more layers.

8. The method of claim 1, wherein the viewport definition is retrieved from the CAD drawing.

9. A computer-readable storage medium storing instructions for specifying a view of the layers of a computer-aided design (CAD) drawing, including instructions for performing the steps of:
   identifying one or more layers of the CAD drawing to include in the display representation, wherein each of the one or more layers is associated with a set of drawing elements and a set of layer display properties, wherein each drawing element specifies a first drawing style to use for the set of drawing elements associated with a respective layer;
   identifying a viewport display property for a first layer of the one or more layers, wherein the viewport display property specifies a second drawing style to use for the set of drawing elements associated with the first layer;

overriding the first drawing style specified in the set of layer display properties with the second drawing style specified by the viewport display property;

generating the display representation, wherein the display representation includes the drawing elements associated with the one or more layers, and the appearance of the drawing elements associated with the first layer is based on the viewport display property; and displaying on a display device a representation of the CAD model.

10. The computer-readable medium storage of claim 9, wherein the viewport display property specifies a line color to use in generating the display representation of the drawing elements associated with the first layer.

11. The computer-readable storage medium of claim 9, wherein the viewport display property specifies a line type to use in generating the display representation of the drawing elements associated with the first layer.

12. The computer-readable storage medium of claim 9, wherein the viewport display property specifies a line weight to use in generating the display representation of the drawing elements associated with the first layer.

13. The computer-readable storage medium of claim 9, wherein the viewport display property specifies a plot style to use in generating the display representation of the drawing elements associated with the first layer.

14. The computer-readable storage medium of claim 9, wherein a viewport definition specifies a display view type and zoom factor to use in generating the display representation.

15. The computer-readable storage medium of claim 14, wherein the display view type is a plan, elevation, or sectional view of the one or more layers.

16. The computer-readable storage medium of claim 9, wherein the viewport definition is retrieved from the CAD drawing.

17. A computer-implemented method of creating a viewport display of the layers of a computer-aided design (CAD) drawing stored on a computing device, comprising:

loading the computer-aided design (CAD) drawing into a system memory of the computing device;

specifying a viewport definition that includes one or more layers of the CAD drawing to be used in the display representation, wherein each layer includes a set of drawing elements and a set of layer display properties;

defining a viewport-specific display property for a first layer of the one or more layers, wherein the viewport-specific display property overrides a drawing style specified in the set of layer display properties for the first layer; and invoking a model view tool configured to generate the display representation, wherein the display representation includes the drawing elements associated with the one or more layers and the appearance of the drawing elements associated with the first layer is based on the viewport-specific display property.

18. The method of claim 17, wherein the viewport-specific display property specifies a line color to use in generating the display representation of the drawing elements associated with the first layer.

19. The method of claim 17, wherein the viewport-specific display property specifies a line type to use in generating the display representation of the drawing elements associated with the first layer.

20. The method of claim 17, wherein the viewport-specific display property specifies a line weight to use in generating the display representation of the drawing elements associated with the first layer.

21. The method of claim 17, wherein the viewport display property specifies a plot style to use in generating the display representation of the drawing elements associated with the first layer.

22. The method of claim 17, wherein the viewport definition specifies a display view type and zoom factor to use in generating the display representation.

23. The method of claim 22, wherein the display view type is a plan, elevation, or sectional view of the one or more layers.

* * * * *